(12) United States Patent
Siegle et al.

(10) Patent No.: US 7,033,849 B2
(45) Date of Patent: Apr. 25, 2006

(54) METHOD OF ADJUSTING OR LOCALLY MODIFYING A MAGNETIZATION IN A LAYER OF A MAGNETORESISTIVE LAYER SYSTEM, HEAT STAMP FOR HEATING THE MAGNETORESISTIVE LAYER SYSTEM, AND USE OF SAME

(75) Inventors: Henrik Siegle, Leonberg (DE); Andrew Johnson, Stuttgart (DE); Ulrich May, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 302 days.

(21) Appl. No.: 10/614,540

(22) Filed: Jul. 7, 2003

(65) Prior Publication Data
US 2004/0078959 A1    Apr. 29, 2004

(30) Foreign Application Priority Data
Jul. 6, 2002    (DE) ................. 102 30 455

(51) Int. Cl.
*H01L 21/00*    (2006.01)
(52) U.S. Cl. .............. 438/22; 438/26; 438/61
(58) Field of Classification Search ......... 438/22, 438/26, 28, 56, 61
See application file for complete search history.

(56) References Cited

U.S. PATENT DOCUMENTS

| 4,670,088 | A | 6/1987 | Tsaur et al. | |
| 2001/0055775 | A1 | 12/2001 | Schultz et al. | |
| 2002/0030950 | A1* | 3/2002 | Sano et al. | 360/324.11 |
| 2002/0126423 | A1* | 9/2002 | Terunuma et al. | 360/319 |

FOREIGN PATENT DOCUMENTS

| DE | 198 30 344 | 1/2000 |
| DE | 198 43 348 | 3/2000 |

(Continued)

OTHER PUBLICATIONS

Lee K et al., "Enhanced tunneling magnetoresistance and thermal stability of magnetic tunnel junction by rapid thermal anneal", Journal of Magnetism and Magnetic Materials, Elsevier, Amstrdam, NL., Bd. 239, Nr. 1-3, Feb. 2002, S. 120-122, XP-004351733.

(Continued)

*Primary Examiner*—Phuc T. Dang
(74) *Attorney, Agent, or Firm*—Kenyon & Kenyon

(57) ABSTRACT

A method of adjusting or locally modifying the direction of magnetization of a ferromagnetic layer in a magnetoresistive layer system using a heat stamp is described, the ferromagnetic layer being stabilized over an antiferromagnetic layer. The antiferromagnetic layer is heated, using a heat stamp, over a threshold temperature, above which the influence of this layer on the direction of magnetization of the adjacent ferromagnetic layer disappears; subsequently, the ferromagnetic layer is exposed to an external magnetic field of a predefined direction, and finally the antiferromagnetic layer is cooled again below the threshold temperature. In addition, a heat stamp having a base body and a heatable stamp structure connected to the base body and matching the dimensions of or similar to the magnetoresistive layer system is described. The heat stamp and the method described are suitable in particular for manufacturing a magnetoresistive layer system operating by the spin valve principle, which has a plurality of magnetoresistive layer systems having at least partially different resulting directions of magnetization in the particular layers, the magnetoresistive layer systems being interconnected in the form of a Wheatstone bridge in particular.

8 Claims, 1 Drawing Sheet

FOREIGN PATENT DOCUMENTS

| | | |
|---|---|---|
| DE | 198 43 350 | 3/2000 |
| DE | 101 17 355 | 10/2002 |
| JP | 1007 46 58 | 3/1998 |
| WO | 00/79298 | 12/2000 |
| WO | WO 00/79298 | 12/2000 |

OTHER PUBLICATIONS

Wu et al., "Thermal annealin study of spin valves", Journal of Applied Physics, Bd. 89, Nr. 01-06-11, S.7616-7618, XP-001072884.

* cited by examiner

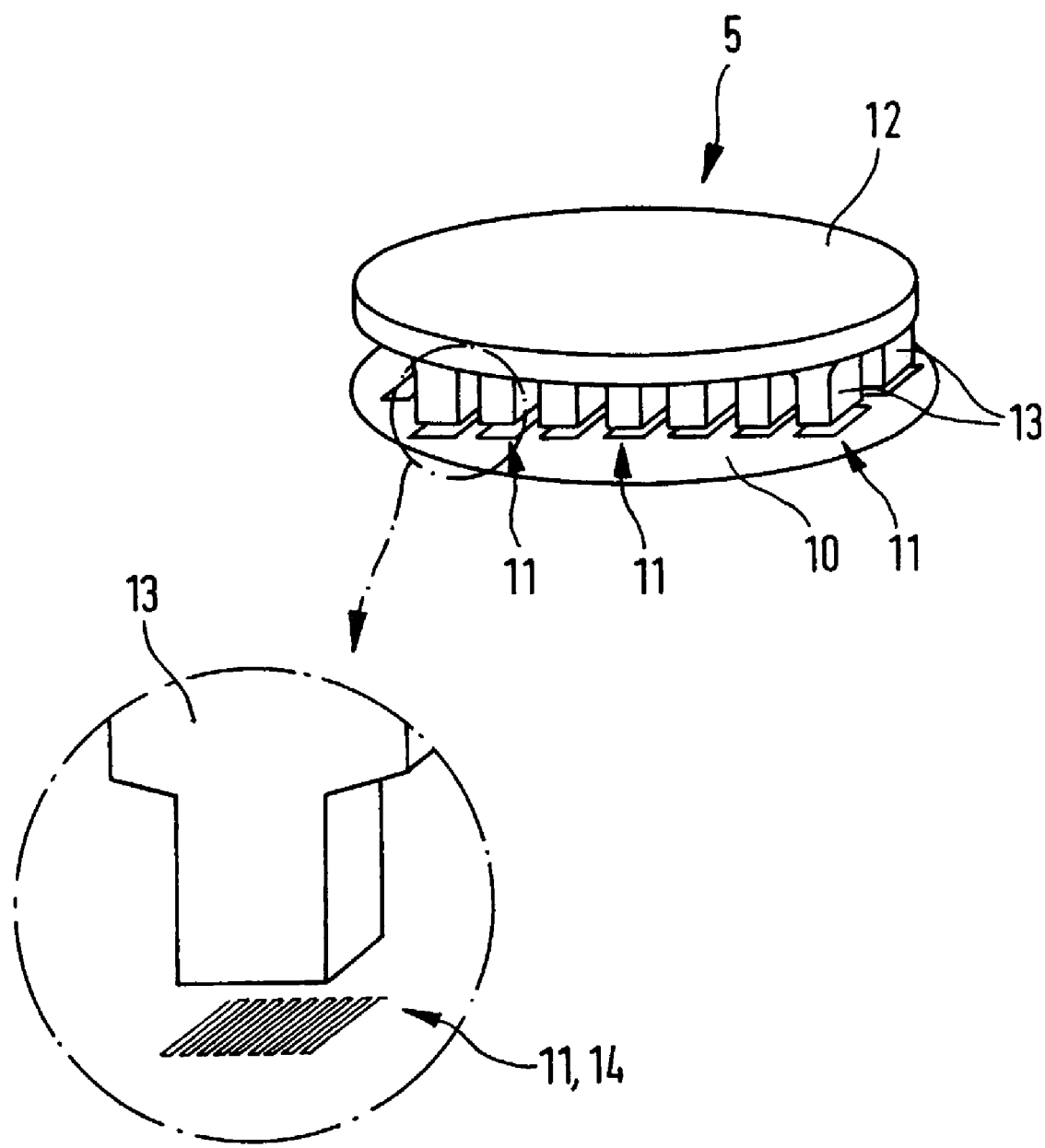

METHOD OF ADJUSTING OR LOCALLY MODIFYING A MAGNETIZATION IN A LAYER OF A MAGNETORESISTIVE LAYER SYSTEM, HEAT STAMP FOR HEATING THE MAGNETORESISTIVE LAYER SYSTEM, AND USE OF SAME

FIELD OF THE INVENTION

The present invention relates to a method of adjusting or locally modifying a resulting direction of magnetization in a layer of a magnetoresistive layer system, to a heat stamp for heating a magnetoresistive layer system, and the use of the method or of the heat stamp for manufacturing a magnetoresistive layer system operating by the spin valve principle.

BACKGROUND INFORMATION

Due to their superior resistivity characteristics, magnetoresistive layer systems according to the spin valve principle offer interesting application possibilities, in particular in motor vehicles, for sensing an angle, a current intensity, or a rotational speed. For this purpose, the layer systems usually have four magnetoresistive layer systems interconnected as a Wheatstone bridge circuit, at least one of which is an active magnetoresistive layer system, i.e., a layer system operating on the basis of the GMR (giant magnetoresistance) or AMR (anisotropic magnetoresistance) effect. The individual magnetoresistive layer systems in such a layer system are furthermore usually designed to be serpentine-shaped in top view having a square or rectangular bottom surface and have a sequence of thin layers forming a "spin valve," i.e., a layer sequence having an antiferromagnetic layer, a first ferromagnetic layer, a non-magnetic layer, and a second ferromagnetic layer.

Due to the "exchange bias effect" appearing at the interface between the two layers, such a spin valve having an antiferromagnetic layer and an adjacent first ferromagnetic layer shows a magnetic hysteresis curve shifted by the "exchange bias field." The structure of a magnetoresistive layer system in the form of a spin valve and its use as a magnetoresistive sensor element has been described in detail, for example, in German Published Patent Application No. 198 43 348, which describes, in particular, the layer structure, the function of the individual layers and the mode of operation of such a sensor element.

To produce a Wheatstone bridge circuit having four magnetoresistive layer systems, for example, it is necessary to be able to define and independently adjust each of the directions of the resulting magnetization in the first ferromagnetic layers adjacent to the antiferromagnetic layers in each of the bridge branches of the Wheatstone bridge. This is accomplished, for example, by heating and subsequently cooling the magnetoresistive layer system and in particular the antiferromagnetic layer integrated therein over a material-specific "blocking temperature," or threshold temperature, in an externally applied magnetic field. This procedure is explained, for example, in PCT Publication No. 00/79298, the magnetoresistive layer system being heated to adjust the resulting direction of magnetization by inputting heat using a laser pulse or by applying an electric current to the layer system.

German Published Patent Application No. 198 30 344 describes another method of adjusting the magnetization of a bias layer of a magnetoresistive sensor element, the bias layer being part of an AAF system (artificial antiferromagnetic system), which includes a bias layer, a flux guiding layer, and a coupling layer situated between the two which antiferromagnetically couples the two layers. In the method described there, the sensor element is initially heated to a predefined temperature using pulsating currents conducted through the sensor element; subsequently a magnetic adjusting field is applied; then the adjusting field is switched off after a predefined period of time, and finally the sensor element is cooled to the initial temperature. German Published Patent Application No. 198 30 344 also explains once more in detail the interconnection of a plurality of magnetoresistive layer systems to form a Wheatstone bridge circuit having different resulting directions of magnetization in the individual layer systems. In addition, this document contains detailed information regarding the layer structure and the composition of the individual layers of the magnetoresistive layer system.

Finally, German Published Patent Application No. 198 43 350 describes an electronic component, in particular a chip element, which has at least one magnetoresistive element situated on a substrate and having a sensor function, and at least one magnetoresistive element situated on a substrate and having a memory function. This document also describes that the directions of magnetization of the individual layers of the elements may be oriented parallel or antiparallel to one another by applying a current to printed conductors running underneath or above the magnetoresistive layer systems or elements.

SUMMARY OF THE INVENTION

An object of the present invention is to provide an additional option to adjust by local warming, the direction of the "exchange bias effect," i.e., the resulting direction of magnetization in a layer of a magnetoresistive layer system which integrates or is connected in a branch of a Wheatstone bridge circuit of a magnetoresistive sensor element, for example, and operates by the spin valve principle. In doing so, heating of the layer system using electric currents flowing through it or the use of laser beams is to be avoided in particular.

The method according to the present invention and the heat stamp according to the present invention have the advantage over the related art that they allow a resulting direction of magnetization in a layer of a magnetoresistive layer system having a ferromagnetic layer and an adjacent antiferromagnetic layer to be adjusted or locally modified in a very simple manner, the ferromagnetic layer having an associated resulting direction of magnetization induced or influenceable, in particular stabilizable, by the antiferromagnetic layer.

The method according to the present invention does not require in particular that additional structures be provided within the magnetoresistive layer system to be able to heat it locally in a controlled manner, and the hardware complexity is considerably reduced compared with laser pulse radiation. In addition, it is advantageous that the method according to the present invention and the heat stamp according to the present invention are suitable for adjusting the resulting direction of magnetization in a plurality of magnetoresistive layer systems located on a common substrate rapidly, on a large surface, and simultaneously.

All in all, the method according to the present invention is considerably more rapid and less expensive compared to the related art, since no additional cost is incurred for the manufacture of an additional layer, which may be used as a current path, and the additional time needed for local heating and inscribing a resulting direction of magnetization using a focused laser beam is substantially reduced.

Thus, it is particularly advantageous if the layer is heated by approaching the heat stamp to the magnetoresistive layer system without contact. It should be emphasized, however, that heating may also be performed by bringing the stamp into contact with a layer of the magnetoresistive layer system, for example, with a normally provided cover layer. Cooling after heating by way of the heat stamp takes place advantageously and simply by removing the stamp or, as an alternative, by cooling the stamp, which is, however, more complicated.

It is furthermore advantageous that the external magnetic field is applied as early as at the time of heating at least the antiferromagnetic layer of the magnetoresistive layer system over the threshold temperature. In principle, however, it is sufficient if this magnetic field is not applied until the threshold temperature is reached or exceeded.

In order to preserve unchanged and as much as possible the achieved adjustment or local modification of the resulting direction of magnetization during the heat treatment using the heat stamp, it is furthermore advantageous if the external magnetic field is preserved after being applied and until the layer or layer system is cooled under the threshold temperature.

It is particularly advantageous in the method according to the present invention that a plurality of magnetoresistive layer systems is provided on a common substrate in particular, the magnetoresistive layer systems being designed as locally bounded areas, for example, as insulated surfaces having a typical size of 5 $\mu m^2$ to 500 $\mu m^2$, as strips having a width of 0.1 $\mu m$ to 100 $\mu m$ and a length of 50 $\mu m$ to 120 mm or as serpentine-shaped structures formed from such strips. In this case, these different magnetoresistive layer systems may be heated over the threshold temperature using the heated stamp either simultaneously, or consecutively, for example, by displacing the stamp and, optionally, changing the direction of the external magnetic field thereafter.

In this context, it is also advantageous if initially only a portion of the magnetoresistive layer systems is heated above the threshold temperature using the heated stamp in particular, so in another portion of the magnetoresistive layer systems the resulting direction of magnetization in the particular layer associated with this portion remains at least almost unaffected by heating by the stamp. In this way, in the case of a plurality of magnetoresistive layer systems, the direction of the resulting magnetization in the first ferromagnetic layer, which is adjacent to the antiferromagnetic layer, may be adjusted or modified locally in a controlled manner in a portion of these layer systems, while no or almost no change in the direction of the resulting magnetization occurs in another portion of these layer systems.

In this manner, it is possible to set a first resulting direction of magnetization in a first portion of the plurality of magnetoresistive layer systems and a second resulting direction of magnetization, which is different from the first resulting direction of magnetization, in particular oriented perpendicularly or opposite thereto, in a second portion of this plurality of magnetoresistive layer systems.

This may be achieved, for example, by initially all magnetoresistive layer systems having the same resulting direction of magnetization, which is then modified using the method according to the present invention in a portion of these magnetoresistive layer systems, or by executing the method according to the present invention for a first portion of the magnetoresistive layer systems having an external magnetic field exhibiting a first direction and then for a second portion of the magnetoresistive layer system having an external magnetic field exhibiting a second direction of magnetization, which is different from the first direction.

The heat stamp is advantageously designed in the form of a heated base body having a stamp structure connected to the base body, the stamp structure being preferably heated via the base body and its lateral dimension being matched with the dimension of the magnetoresistive layer system to be heated or at least having a shape similar thereto. Furthermore, using the heat stamp, a plurality of heatable stamp structures connected to the base body which may be identical or have an at least partly different design may be used simultaneously side by side, for example, on a single heat stamp. The dimension of the individual stamp structures is preferably matched to the magnetoresistive layer systems to be heated by the heat stamp or is at least similar thereto.

As a rule, the stamp structures have at least approximately a cuboid shape with rectangular or square-shaped faces when viewed from the bottom of the stamp, the faces preferably having an area of 5 $\mu m^2$ to 1 $cm^2$, especially preferably 0.5 $mm^2$ to 5 $mm^2$.

It is furthermore advantageous if the stamp structures are heatable independently of one another to different temperatures in particular via a suitable heating device associated with the stamp structures or an appropriate subdivision of the base body. In this case, a first group of stamp structures may be provided, for example, which is heatable to a first temperature, and a second group of stamp structures which is heatable to a second temperature which is different from the first temperature, one of these temperatures being preferably somewhat higher than the threshold temperature and the other temperature being preferably somewhat lower than the threshold temperature.

This procedure prevents mechanical stresses within the magnetoresistive layer system as it is heated and also results in time savings, since more heat is introduced into the layer system, so that the areas to be heated over the threshold temperature are heated more rapidly, and also the layer system whose resulting direction of magnetization is not yet modified in a first step is preheated before these areas are then heated over the threshold temperature using the stamp, in order to also adjust or locally modify the resulting direction of magnetization in those areas.

The method according to the present invention and the heat stamp according to the present invention are particularly suitable for manufacturing a magnetoresistive layer system operating according to the spin valve principle, which has a plurality of magnetoresistive layer systems having at least partly different resulting directions -of magnetization in the respective layer (bias layer), the magnetoresistive layer system being interconnected, for example, with rotational speed sensor elements or angle sensor elements in the form of known Wheatstone bridge circuits. In particular, local heating of individual bridge branches of such a Wheatstone bridge circuit having a plurality of magnetoresistive layer systems is possible using the heat stamp, the stamp being brought into the proximity of the respective bridge branch or into contact therewith, so that heat may be transferred via radiation or conduction to locally heat the respective magnetoresistive layer system, i.e., bridge branch. This allows the resulting direction of magnetization in the bias layer to be adjusted even at the wafer level, i.e., prior to separating the individual layer systems. In this case, a plurality of heat stamps, which may differ by the arrangement, dimensions, and/or heating of the stamp structures, for example, may be used for heating layer systems, in particular layer systems having different structures or dimensions, consecutively or simultaneously at the wafer level.

BRIEF DESCRIPTION OF THE DRAWING

The FIGURE shows a schematic diagram of a front part of a heat stamp situated opposite a substrate, an enlarged detail of the heat stamp in the area of the substrate surface being additionally shown.

DETAILED DESCRIPTION

The present invention is first directed to a magnetoresistive layer system such as known from German Published Patent Application No. 198 43 348, so that a detailed explanation of its function and structure may be dispensed with. Furthermore, a plurality of magnetoresistive layer systems known from German Published Patent Application No. 198 43 348 is interconnected to form a magnetoresistive layer system operating by the spin valve principle in the form of a Wheatstone bridge circuit according to PCT Publication No. 00/79298 or German Published Patent Application No. 198 30 344. Finally, a procedure largely similar to that described in German Published Patent Application No. 198 30 344 and PCT Publication No. 00/79298 or unpublished German Patent Application No. 101 17 355.5 is followed in the method according to the present invention; however, as a basic difference, a heat stamp, i.e., a heated stamp is used instead of current paths or laser pulses here.

The FIGURE shows a heat stamp 5, which is electrically heatable, for example, and which has a base body 12, for example, in the form of a metal plate, and a plurality of heatable stamp structures 13, connected to base body 12. In the present example, these have an essentially cuboidal design and have a typical height of 1 mm to 5 mm and a face area of 0.5 mm$^2$ to 2 mm$^2$, for example. According to the FIGURE, heat stamp 5 is located opposite a substrate 10, on which a plurality of magnetoresistive layer systems 11 have been produced. The FIGURE thus also shows the simultaneous adjustment of the exchange bias direction on the wafer level, i.e., substrate level prior to separation. It should also be mentioned that when heat stamp 5 is turned on for heating, as explained above, an external magnetic field of a defined direction is applied in the known manner. The FIGURE finally shows a detail of heat stamp 5 in the area of an individual stamp structure 13, which is opposite substrate 10. Magnetoresistive layer system 11 is also shown enlarged, so that its serpentine-shaped structure 14 is recognizable in top view. All in all, the shape of heat stamp 5 is optimized so that when it is approached to the serpentine-shaped structure 14, which is to be used as a bridge branch in a Wheatstone bridge circuit in a magnetoresistive layer system operating by the spin valve principle, it is locally heated over a material-specific threshold temperature of 220° C., for example (blocking temperature).

What is claimed is:

1. A method of one of adjusting and locally modifying a resulting direction of magnetization in a layer of a magnetoresistive layer system having a ferromagnetic layer and an adjacent antiferromagnetic layer, the ferromagnetic layer having a resulting magnetization with an associated resulting direction of magnetization that is one of induced and influenceable by the adjacent antiferromagnetic layer, the method comprising:

heating at least the antiferromagnetic layer by a heated stamp over a threshold temperature above which an influence of the antiferromagnetic layer on the resulting direction of magnetization of the adjacent ferromagnetic layer at least largely disappears;

exposing at least an area of the ferromagnetic layer adjacent to the adjacent antiferromagnetic layer to an external magnetic field of a predefined direction;

subsequently cooling the antiferromagnetic layer again below the threshold temperature; and providing a plurality of magnetoresistive layer systems on a common substrate, the plurality of magnetoresistive layer systems are designed as locally bounded areas to have insulated surfaces having a size of 5 μm$^2$ to 500 μm$^2$, and one of strips having a width of 0.5 μm to 100 μm and a length of 50 μm to 120 mm and a serpentine-shaped structures having the strips, wherein the plurality of magnetoresistive layer systems is heated over the threshold temperature using the stamp one of at least partly consecutively and simultaneously.

2. The method as recited in claim 1 wherein:

the cooling is performed by one of removing and cooling the stamp, and a heating is performed one of by a contactless approximation of the stamp to the magnetoresistive layer system and by bringing the stamp into contact with a layer of the magnetoresistive layer system.

3. The method as recited in claim 1, further comprising:
applying the external magnetic field as early as one of at a time of heating to the threshold temperature and after reaching the threshold temperature.

4. The method as recited in claim 1, further comprising:
preserving the external magnetic field after application until the cooling below the threshold temperature.

5. The method as recited in claim 1, wherein:
only a portion of the plurality of magnetoresistive layer systems is heated above the threshold temperature using the stamp, so that in another portion of the plurality of magnetoresistive layer systems, the resulting direction of magnetization in the particular layer associated with the portion remains almost unaffected by heating by the stamp.

6. The method as recited in claim 1, wherein:
in the locally bounded areas, the resulting direction of magnetization in the layer of the plurality of magnetoresistive layer systems is one of adjusted and modified using the stamp so that a first portion of the plurality of magnetoresistive layer systems has a first resulting direction of magnetization in its particular layer, and a second portion of the plurality of magnetoresistive layer systems has a second resulting direction of magnetization that is different from the first resulting direction of magnetization.

7. The method as recited in claim 6, wherein:
the second resulting direction is oriented one of perpendicularly or opposite to the first resulting direction, in its layer.

8. The method as recited in claim 5, wherein:
initially only the first portion of the plurality of magnetoresistive layer systems is heated over the threshold temperature using the stamp, subsequently a direction of the external magnetic field is changed, and then only the second portion of the plurality of magnetoresistive layer systems is heated over the threshold temperature using one of the stamp and a second stamp.

* * * * *